(12) United States Patent
Huang et al.

(10) Patent No.: US 10,622,253 B2
(45) Date of Patent: Apr. 14, 2020

(54) MANUFACTURING METHOD OF SEMICONDUCTOR DEVICE

(71) Applicant: United Microelectronics Corp., Hsinchu (TW)

(72) Inventors: Li-Da Huang, Singapore (SG); Wei-Hui Gao, Singapore (SG); Chien-Kee Pang, Singapore (SG); Wen-Bo Ding, Singapore (SG); Sheng Zhang, Singapore (SG); Wen-Shen Li, Singapore (SG); Chee-Hau Ng, Singapore (SG); Xiaoyuan Zhi, Singapore (SG)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 16/006,739

(22) Filed: Jun. 12, 2018

(65) Prior Publication Data

US 2019/0378757 A1 Dec. 12, 2019

(51) Int. Cl.
| | | |
|---|---|---|
| *H01L 21/00* | (2006.01) | |
| *H01L 21/768* | (2006.01) | |
| *H01L 21/762* | (2006.01) | |
| *H01L 23/522* | (2006.01) | |
| *H01L 29/786* | (2006.01) | |

(52) U.S. Cl.
CPC .... *H01L 21/76898* (2013.01); *H01L 21/7624* (2013.01); *H01L 21/76826* (2013.01); *H01L 21/76828* (2013.01); *H01L 23/5227* (2013.01); *H01L 29/78603* (2013.01); *H01L 29/78651* (2013.01)

(58) Field of Classification Search
CPC ......... H01L 21/76898; H01L 21/76828; H01L 23/5227

See application file for complete search history.

(56) References Cited

U.S. PATENT DOCUMENTS

| | | | |
|---|---|---|---|
| 4,113,514 A | 9/1978 | Pankove et al. | |
| 5,494,860 A | 2/1996 | McDevitt et al. | |
| 6,261,891 B1 * | 7/2001 | Cheng | H01L 21/02129 257/E21.269 |
| 6,673,726 B1 | 1/2004 | Lane et al. | |
| 8,026,169 B2 | 9/2011 | You et al. | |
| 8,828,779 B2 * | 9/2014 | Zhao | H01L 31/0232 257/E21.532 |
| 9,773,697 B2 * | 9/2017 | Tsukiyama | H01L 21/76826 |
| 10,224,240 B1 * | 3/2019 | Funayama | H01L 23/5226 |
| 2003/0140988 A1 * | 7/2003 | Gandikota | C23C 18/1651 148/527 |
| 2011/0014784 A1 * | 1/2011 | Chun-Chileh | H01L 21/32136 438/612 |
| 2013/0020662 A1 * | 1/2013 | Kao | H01L 27/14632 257/431 |

(Continued)

*Primary Examiner* — Laura M Menz
(74) *Attorney, Agent, or Firm* — J.C. Patents

(57) ABSTRACT

A manufacturing method of a semiconductor device including the following steps is provided. A substrate having a device structure and a first interconnection structure on a front side is provided. A first annealing process is performed in an atmosphere of pure hydrogen at a first temperature. A second interconnection structure is formed on a back side of the substrate. A second annealing process is performed in an atmosphere of gas mixture including hydrogen at a second temperature.

15 Claims, 7 Drawing Sheets

(56) References Cited

U.S. PATENT DOCUMENTS

| | | | | |
|---|---|---|---|---|
| 2014/0120653 A1* | 5/2014 | Zhao | .................. | H01L 31/0232 |
| | | | | 438/70 |
| 2014/0342473 A1* | 11/2014 | Zhang | ..................... | H01L 22/14 |
| | | | | 438/14 |
| 2016/0225850 A1* | 8/2016 | Chen | ................. | H01L 29/66439 |
| 2019/0378757 A1* | 12/2019 | Huang | ............. | H01L 21/76826 |

\* cited by examiner

MANUFACTURING METHOD OF SEMICONDUCTOR DEVICE

BACKGROUND

Technical Field

The disclosure relates to a manufacturing method of an integrated circuit, and particularly relates to a manufacturing method of a semiconductor device.

Description of Related Art

According to the increase of the demand for high-performance circuits, semiconductor-on-insulator (SOI) technology has attracted much attention because the traditional bulk metal-oxide-semiconductor field-effect transistor (MOSFET) structure cannot overcome issues, such as short-channel effects, parasitic capacitance, and current leakage.

In the SOI technology, an insulating layer (e.g., a buried oxide (BOX) layer) is formed between a MOSFET device and a bulk substrate. Therefore, the MOSFET device has a smaller parasitic capacitance and thus exhibits more desirable speed properties in circuit operations. With the advantages of the SOI technology, it is expected that the SOI MOSFET device will become the mainstream device structure. Recently, the SOI technology are appealing for high frequency applications, such as radio frequency (RF) communication circuits. However, there are still some challenges to overcome.

SUMMARY

Accordingly, the present disclosure provides a manufacturing method of a semiconductor device to reduce stresses of interconnection structures and achieve the desired electrical characteristics thereof. Moreover, the performance of the device structure and the performance of second harmonic distortion are improved simultaneously.

A manufacturing method of a semiconductor device is provided. The manufacturing method includes the following steps. A substrate having a device structure and a first interconnection structure on a front side is provided. A first annealing process is performed in an atmosphere of pure hydrogen at a first temperature. A second interconnection structure is formed on a back side of the substrate. A second annealing process is performed in an atmosphere of gas mixture including hydrogen at a second temperature.

According to some embodiments of the disclosure, the first temperature is higher than the second temperature.

According to some embodiments of the disclosure, the first temperature is between 350° C. and 450° C.

According to some embodiments of the disclosure, the second temperature is between 150° C. and 250° C.

According to some embodiments of the disclosure, the gas mixture includes 10% to 20% of hydrogen.

According to some embodiments of the disclosure, the gas mixture further includes nitrogen, helium, neon, argon, or a combination thereof.

According to some embodiments of the disclosure, the first annealing process is performed between 30 minutes and 2 hours.

According to some embodiments of the disclosure, the second annealing process is performed between 30 minutes and 2 hours.

According to some embodiments of the disclosure, a material of the first interconnection structure includes Al, Al alloy, Cu, Cu alloy, or a combination thereof.

According to some embodiments of the disclosure, a material of the second interconnection structure includes Al, Al alloy, Cu, Cu alloy, or a combination thereof.

According to some embodiments of the disclosure, the first interconnection structure includes a plurality of dielectric layers and a plurality of circuit structures.

According to some embodiments of the disclosure, the second interconnection structure includes a plurality of dielectric layers and a plurality of circuit structures.

According to some embodiments of the disclosure, the second interconnection structure is electrically connected to the device structure and the first interconnection structure.

According to some embodiments of the disclosure, the manufacturing method further includes bonding the substrate with a wafer via the front side of the substrate after performing the first annealing process and before performing the second annealing process.

According to some embodiments of the disclosure, the wafer includes a trap rich layer.

Based on the above, in the present disclosure, after the device structure and the interconnection structure are formed on the front side of the substrate, the first annealing process is performed in the atmosphere of pure hydrogen at a higher temperature. Thus, the performance of the device structure is improved. Also, the stresses of the interconnection structure on the front side of the substrate can be reduced, and the desired electrical characteristics of the interconnection structure can also be achieved. Then, after the interconnection structure is formed on the back side of the substrate, the second annealing process can be performed in the atmosphere of gas mixture including hydrogen at a lower temperature. Similarly, the stresses of the interconnection structure on the back side of the substrate can be reduced, and the desired electrical characteristics of the interconnection structure can also be achieved. Furthermore, if the substrate with the device structure and the interconnection structure on the front side is bonded with the trap rich layer (TRL) wafer after performing the first annealing process, only the second annealing process with a lower temperature is performed to the TRL wafer. Thereby, the performance of the second harmonic distortion is improved. As a result, the performance of the device structure and the second harmonic distortion can be improved simultaneously.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
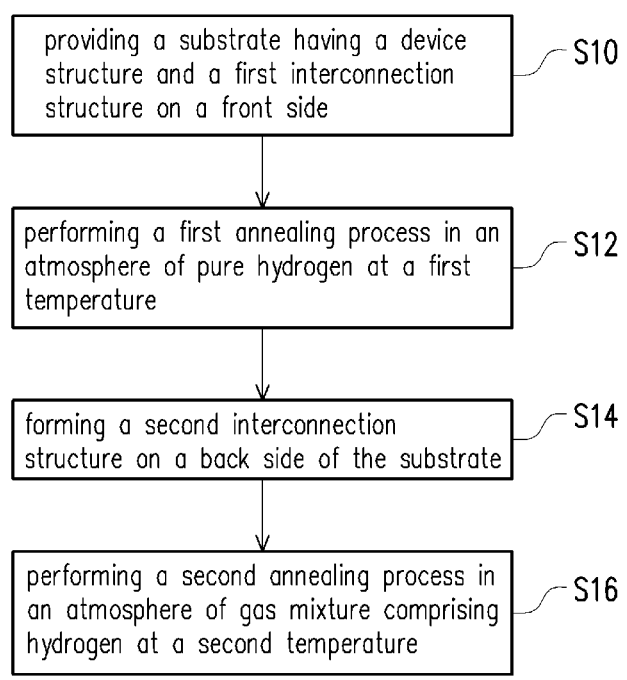
FIG. 1 is a flow chart illustrating a manufacturing method of a semiconductor device according to some embodiments of the disclosure.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a flow chart illustrating a manufacturing method of a semiconductor device according to some embodiments of the disclosure. FIG. 2A to FIG. 2F are cross-sectional views illustrating a manufacturing method of a semiconductor device according to some embodiments of the disclosure. In the present embodiment, the semiconductor device may be a semiconductor device manufactured according to a radio frequency (RF) SOI technique, but the invention is not limited thereto.

Figure 2A:
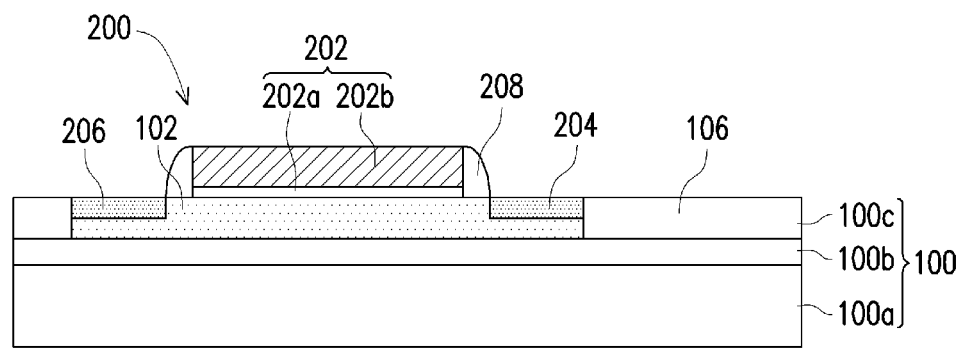
FIG. 2A to FIG. 2F are cross-sectional views illustrating a manufacturing method of a semiconductor device according to some embodiments of the disclosure.
Figure 2B:
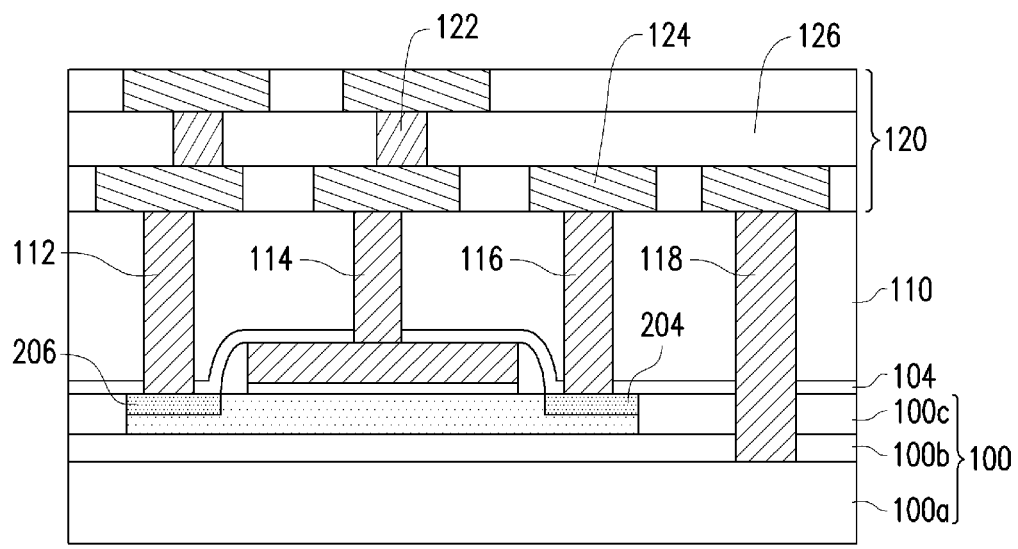

Referring to FIG. 1, FIG. 2A, and FIG. 2B, a manufacturing method of a semiconductor device of the present embodiment includes the following steps. A step S10 is performed, such that a substrate 100 having a device structure 200 and a first interconnection structure 120 on a front side is provided.

Referring to FIG. 2A, the substrate 100 has the front side and a back side opposite to each other. In some embodiments, the substrate 100 may be a semiconductor substrate, for example. The semiconductor substrate may be a doped silicon substrate, an undoped silicon substrate, or a silicon-on-insulator (SOI) substrate, for example. The doped silicon substrate may be P-type doped, N-type doped, or a combination thereof. In the exemplary embodiment, the substrate 100 is, for example, the SOI substrate including a bulk silicon layer 100a, an insulating layer 100b, and a thin silicon layer 100c, but the invention is not limited thereto. Specifically, the insulating layer 100b is disposed between the bulk silicon layer 100a and the thin silicon layer 100c. The thin silicon layer 100c is closer to the front side of the substrate 100, and the bulk silicon layer 100a is closer to the back side of the substrate 100, for example. In some embodiments, a material of the insulating layer 100b includes an oxide, such as a silicon oxide layer. For instance, the insulating layer 100b may be a buried oxide (BOX) layer disposed on the bulk silicon layer 100a, but the invention is not limited thereto.

In some embodiments, a plurality of isolation structures 106 are formed on the front side of the substrate 100 to define an active region 102 for the device structure 200. In other words, the isolation structures 106 are formed in the thin silicon layer 100c to define an active region 102 for the device structure 200. In the exemplary embodiment, only one active region 102 is shown in FIG. 2A, but the invention is not limited thereto. In some embodiments, the isolation structures 106 may be shallow trench isolation (STI) structures, for example. A material of the isolation structure 106 includes an insulating material. The insulating material may be silicon oxide, silicon nitride, or a combination thereof, for example.

In the exemplary embodiment, the device structure 200 is a transistor, for example, but the invention is not limited thereto. Specifically, the device structure 200 includes a doped regions 204 and 206, a gate structure 202, and spacers 208. The device structure 200 is disposed on the active region 102. The gate structure 202 includes a gate dielectric layer 202a and a gate 202b. The gate dielectric layer 202a is disposed between the gate 202b and the active region 102, so as to electrically isolate the gate 202b from the active region 102. In some embodiments, a material of the gate dielectric layer 202a includes silicon oxide, for example. A method of forming the gate dielectric layer 202a includes thermal oxidation or chemical vapor deposition (CVD), for example. A material of the gate 202b includes polycrystalline silicon, for example. A method of forming the gate 202b includes CVD, for example. The spacers 208 are disposed on two sides of the gate structure 202 on the active region 102. A method of forming the spacers 208 is familiar to people skilled in the art and shall not be detailed here. The doped regions 204 and 206 are respectively disposed in the active region 102 on two sides of the gate structure 202. A method of forming the doped regions 204 and 206 includes, for example, performing ion implantation by using the gate structure 202 and the spacers 208 as a mask to implant a dopant into the active region 102. In some embodiments, the doped region 204 may be a source, and the doped region 206 may be a drain. However, the invention is not limited thereto. In other embodiments, the doped region 204 may be a drain, and the doped region 206 may be a source. In some embodiments, the doped regions 204 and 206 are of the same conductivity type. For example, the doped regions 204 and 206 may be of N-type conductivity, so that the device structure 200 is an N-type transistor. Conversely, the doped regions 204 and 206 may be of P-type conductivity, so that the device structure 200 is a P-type transistor. In an alternative embodiment, the device structure 200 includes a radio frequency (RF) transistor, but the invention is not limited thereto.

Referring to FIG. 2B, a protective layer 104 is conformally formed on the substrate 100. Specifically, the protective layer 104 conformally covers the device structure 200 and top surfaces of the isolation structures 106. In some embodiments, a material of the protective layer 104 includes a nitride, such as silicon nitride, silicon oxynitride, or a combination thereof. A method of forming the protective layer 104 includes CVD or atomic layer deposition (ALD), for example.

After that, a plurality of contacts are formed on the protective layer 104. In detail, an interlayer dielectric layer 110 is formed on the protective layer 104 first. In some embodiments, a material of the interlayer dielectric layer 110 includes a dielectric material, such as silicon oxide, silicon nitride, silicon oxynitride, or a combination thereof. A method of forming the interlayer dielectric layer 110 includes CVD, for example. Next, a plurality of openings (not shown) are formed in the interlayer dielectric layer 110 and the protective layer 114. In some embodiments, a method of forming the openings includes an etching process, such as a dry etching process. The dry etching process is a reactive ion etching (RIE) process, for example. Then, a conductor material (not shown) is filled in the openings and covers the interlayer dielectric layer 110. Thereafter, a planarization process is performed to remove the conductor material on the interlayer dielectric layer 110. In some embodiment, the planarization process is, for example, a chemical-mechanical polishing (CMP) method or an etch-back process. In some embodiment, the conductor material includes a metal material, such as tungsten (W), aluminum (Al), copper (Cu), or a combination thereof. Thus, the contacts 112, 114, 116, and 118 are formed. Specifically, the contacts 112 and 116 are electrically connected to the doped regions 206 and 204 respectively. The contact 114 is electrically connected to the gate structure 202. The contact 118 is disposed in the interlayer dielectric layer 110, the protective layer 104, the isolation structure 106, and the insulating layer 100b beside the device structure 200. However, the invention is not limited thereto.

Then, the first interconnection structure 120 is formed on the interlayer dielectric layer 110. Specifically, the first interconnection structure 120 includes a plurality of dielectric layers 126 and a plurality of circuit structures 124. The circuit structures 124 are disposed in the dielectric layer 126 to be electrically connected to the contacts 112, 114, 116, and 118 respectively. Furthermore, a plurality of vias 122 are formed to provide interconnection between the circuit structures 124 in different metal layers. In the exemplary embodiment, two metal layers are shown in FIG. 2B. In detail, four circuit structures 124 are depicted in a first metal layer, and two circuit structures 124 are depicted in a second metal layer, but the invention is not limited thereto. In addition, although only two metal layers are depicted herein, this is merely illustrative and it should be understood that the number of the metal layers may be less or more according to the demands. In some embodiments, a material of the dielectric layer 126 includes a dielectric material, such as silicon oxide, silicon nitride, silicon oxynitride, or a combination thereof. The dielectric layer 126 may be one layer or more, for example. In some embodiments, a material of the circuit structure 124 and the via 122 includes a metal material, such as Al, Al alloy, Cu, Cu alloy, or a combination thereof. A method of forming the circuit structure 124 and the via 122 includes damascene, or dual damascene, for example.

Figure 2C:
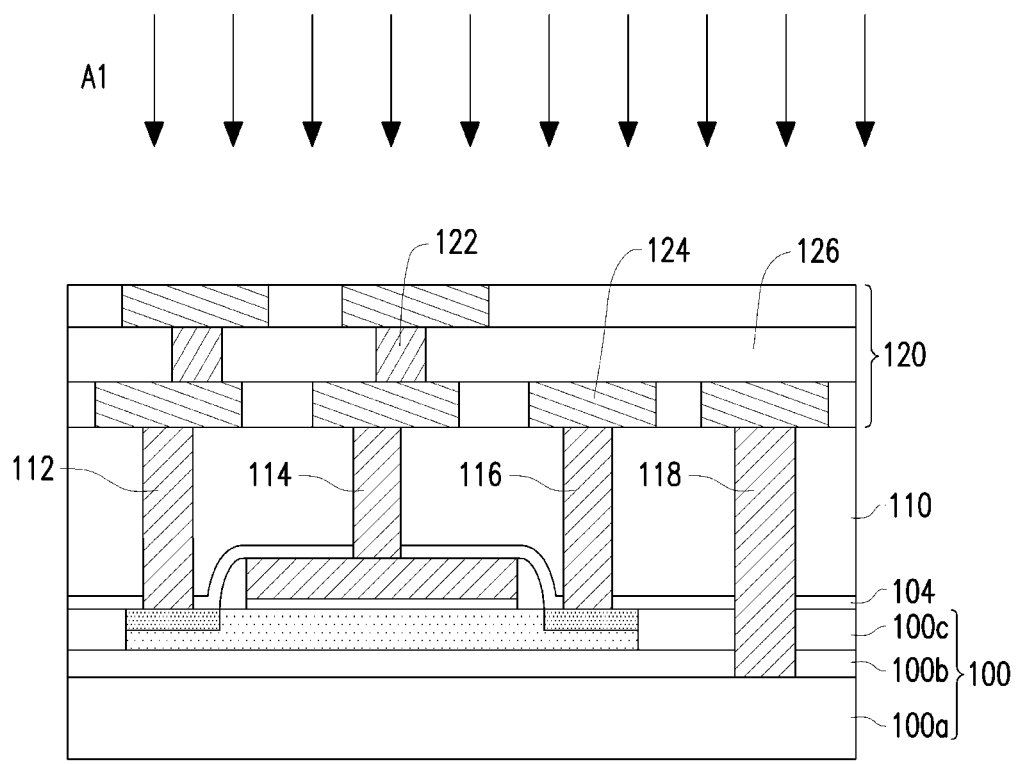

Referring to FIG. 1 and FIG. 2C, a step S12 is performed, such that a first annealing process A1 is performed in an atmosphere of pure hydrogen at a first temperature. In some embodiments, the first temperature is between 350° C. and 450° C. In other embodiments, the first temperature is between 380° C. and 420° C. In some embodiments, the first annealing process A1 is performed between 30 minutes and 2 hours. However, the invention is not limited thereto.

It should be noted that, the dangling bonds existing in the device structure 200 are neutralized by attaching hydrogen atoms at this step. Therefore, the performance of the device structure 200 is improved. In addition, since the first annealing process A1 is performed in the atmosphere of pure hydrogen at a high temperature, the dangling bonds in the device structure 200 are efficiently reduced. Furthermore, since the performance of the device structure is improved at this step, a second annealing process A2 (described in detail later) can be performed at a lower temperature. On the other hand, after performing the first annealing process Al, internal and/or external stresses of the metallization structure (e.g., the first interconnection structure 120) can be reduced, and the desired electrical characteristics, such as electromigration, can also be achieved.

Figure 2D:
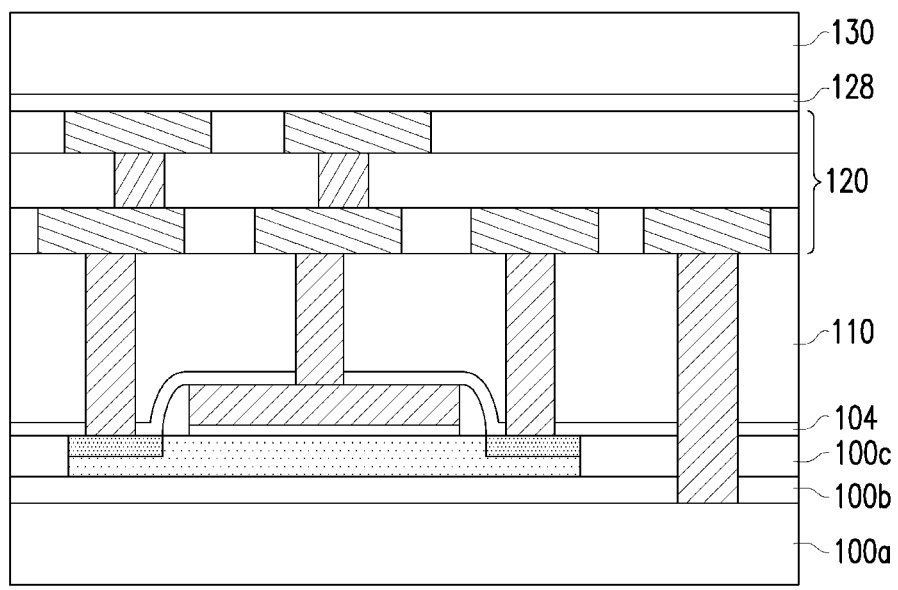

Referring to FIG. 2D, the substrate 100 having the device structure 200 and the first interconnection structure 120 on the front side is bonded with a wafer 130 via the front side of the substrate 100. In the exemplary embodiment, the wafer 130 may be a trap rich layer (TRL) wafer. In other words, the wafer 130 includes a TRL, for example, and the TRL may be a bonding interface between the first interconnection structure 120 and the wafer 130. Specifically, the bonding interface is an amorphous layer requiring more dangling bonds to trap RF signal noise. However, the invention is not limited thereto.

In some embodiments, before the substrate 100 having the device structure 200 and the first interconnection structure 120 on the front side is bonded with the wafer 130, a bonding layer 128 is formed on the first interconnection structure 120. The bonding layer 128 may be a combination of one or more insulating layers and passivation layers to isolate and protect the first interconnection structure 120 and the device structure 200. In addition, the bonding layer 128 is used to bond the first interconnection structure 120 and the wafer 130. In some embodiments, a method of forming the bonding layer 128 includes CVD or thermal oxidation, for example. However, the invention is not limited thereto.

Figure 2E:
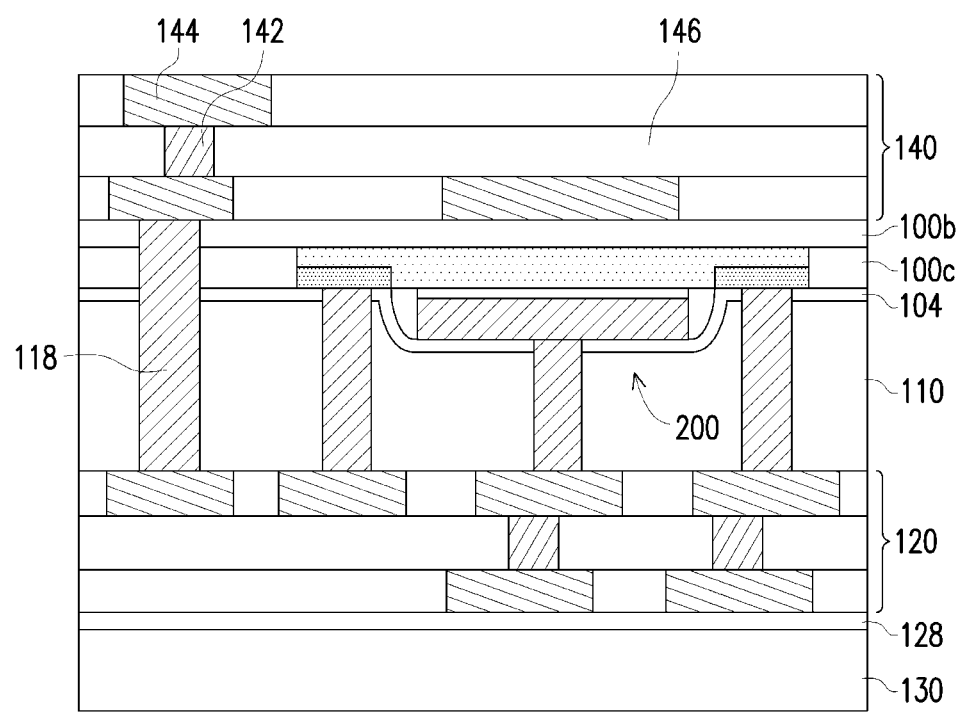

Referring to FIG. 1 and FIG. 2E, a step S14 is performed, such that a second interconnection structure 140 is formed on the back side of the substrate 100. In detail, after the substrate 100 having the device structure 200 and the first interconnection structure 120 on the front side is bonded with the wafer 130, the wafer 130 is attached to a carrier (not shown), and the structure of FIG. 2D is turned upside down. Then, a wet etching process is performed to thin or remove the substrate 100. In the exemplary embodiment, the substrate 100 is partially removed. Specifically, the bulk silicon layer 100a is removed as shown in FIG. 2E, but the invention is not limited thereto. Thereafter, the second interconnection structure 140 is formed on the insulating layer 100b. Specifically, the second interconnection structure 140 includes a plurality of dielectric layers 146 and a plurality of circuit structures 144. In the exemplary embodiment, the circuit structures 144 are disposed in the dielectric layer 146. As shown in FIG. 2E, the circuit structures 144 may be electrically connected to the first interconnection structure 120 via the contacts 118, and the circuit structures 144 may be electrically connected to the device structure 200, but the invention is not limited thereto. Furthermore, a plurality of vias 142 are formed to provide interconnection between the circuit structures 144 in different metal layers. In the exemplary embodiment, two metal layers are shown in FIG. 2E. In detail, two circuit structures 144 are depicted in a first metal layer, and one circuit structure 144 is depicted in a second metal layer, but the invention is not limited thereto. In addition, although only two metal layers are depicted herein, this is merely illustrative and it should be understood that the number of the metal layers may be less or more according to the demands. In some embodiments, a material of the dielectric layer 146 includes a dielectric material, such as silicon oxide, silicon nitride, silicon oxynitride, or a combination thereof. The dielectric layer 146 may be one layer or more, for example. In some embodiments, a material of the circuit structure 144 and the via 142 includes a metal material, such as Al, Al alloy, Cu, Cu alloy, or a combination thereof. A method of forming the circuit structure 144 and the via 142 includes damascene, or dual damascene, for example.

In other embodiments, an inductor structure (not shown) may be formed on the back side of the substrate 100 according to the demands. For instance, the inductor structure may be electrically connected to integrated circuits on the front side of the substrate 100 through the substrate 100. In some embodiments, a passivation layer (not shown) may be formed on the second interconnection structure 140. However, the invention is not limited thereto.

Figure 2F:
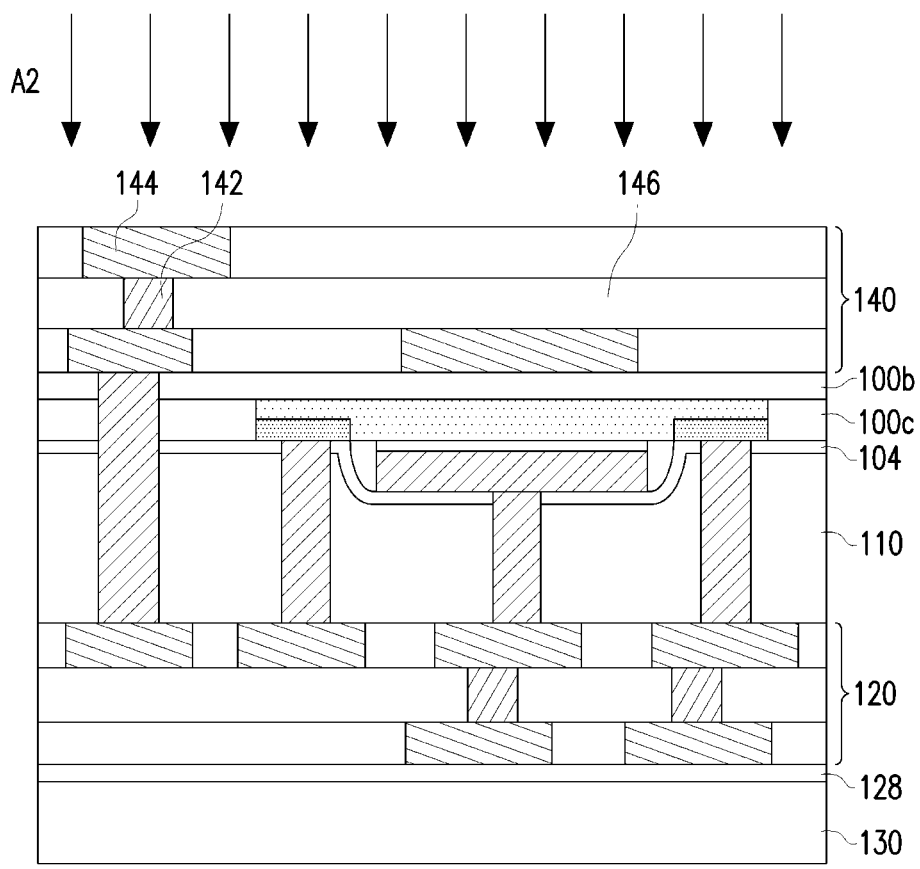

Referring to FIG. 1 and FIG. 2F, a step S16 is performed, such that a second annealing process A2 is performed in an atmosphere of gas mixture including hydrogen at a second temperature. In some embodiments, the second temperature is between 150° C. and 250° C. In other embodiments, the second temperature is between 180° C. and 220° C. Specifically, the first temperature is higher than the second temperature. In some embodiments, the gas mixture includes 10% to 20% of hydrogen, for example. In some embodiments, the gas mixture further includes nitrogen, helium, neon, argon, or a combination thereof, for example. In the exemplary embodiment, the gas mixture includes hydrogen and nitrogen, but the invention is not limited thereto. In some embodiments, the second annealing process A2 is performed between 30 minutes and 2 hours. In other embodiments, the second annealing process A2 is performed for approximately 30 minutes, for example. However, the invention is not limited thereto.

It should be noted that, in the traditional annealing process, the wafer is annealed at a temperature of about 400° C. in the atmosphere of gas containing hydrogen to repair the damage caused by various process steps, such as a plasma etching process or ion implantation. Since hydrogen gas molecules are able to diffuse throughout the circuit structures of the semiconductor device to react with the dangling bonds due to their small size, the dangling bonds existing in the device structure are reduced. Thus, the performance of the device structure is improved. However, the performance of second harmonic distortion is degraded in a such high temperature condition. Accordingly, in the embodiment of the disclosure, after the device structure is formed on the front side of the substrate, the first annealing process is performed in the atmosphere of pure hydrogen at a high temperature. The performance of the device structure is improved at this step. Then, the substrate with the device structure and the interconnection structure is bonded with another wafer, such as a TRL wafer. Thereafter, another interconnection structure is formed on the back side of the substrate. Subsequently, the second annealing process can be performed in the atmosphere of gas mixture including hydrogen at a lower temperature, instead of original high temperature. Therefore, the dangling bonds can be kept in this lower temperature condition, thereby improving the performance of the second harmonic distortion. On the other hand, after the second annealing process A2, internal and/or external stresses of the metallization structure (e.g., the second interconnection structure 140) can be reduced, and the desired electrical characteristics can also be achieved.

Figure 3:
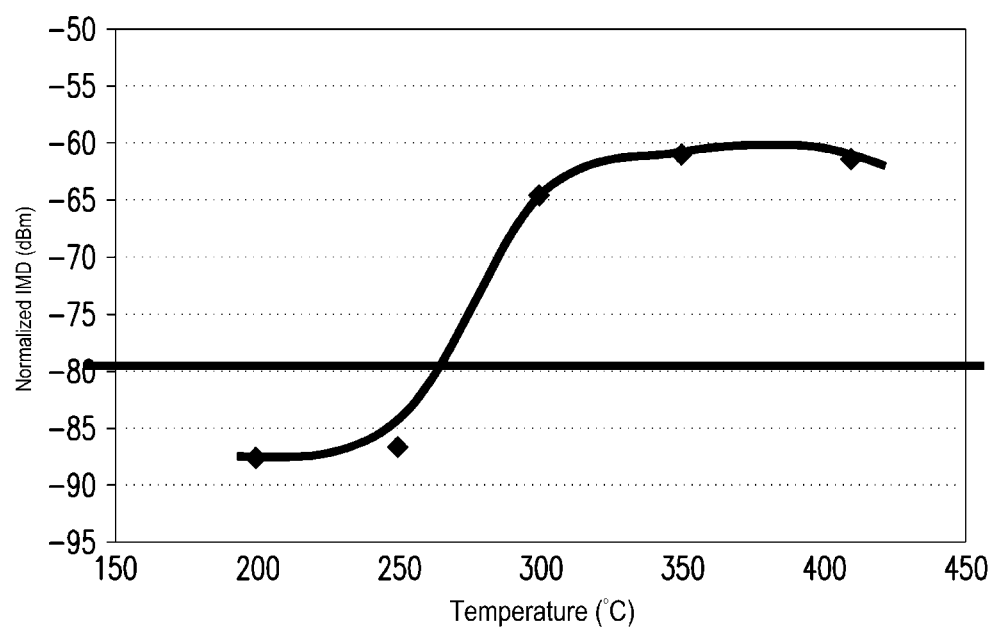
FIG. 3 is a graph illustrating normalized intermodulation distortion (IMD) power when the second annealing process is performed at different temperatures.

FIG. 3 is a graph illustrating normalized intermodulation distortion (IMD) power when the second annealing process is performed at different temperatures.

Referring to FIG. 3, when the second annealing process A2 is performed below 250° C., the normalized intermodulation distortion (IMD) power of the second harmonic distortion is lower than approximately −85 dBm. Particularly, when the second annealing process A2 is performed at 200° C., the IMD power of the second harmonic distortion is approximately −87 dBm which meets a spec requirement. In other words, the second annealing process A2 is performed at a lower temperature, so that the number of the traps is not decreased. Thus, the performance of the second harmonic distortion is improved. Moreover, since the first annealing process A1 is performed in an atmosphere of pure hydrogen at a higher temperature, the device performance is also improved.

In view of above, in the present disclosure, after the device structure and the interconnection structure are formed on the front side of the substrate, the first annealing process is performed in the atmosphere of pure hydrogen at a higher temperature. Thus, the performance of the device structure is improved. Also, the stresses of the interconnection structure on the front side of the substrate can be reduced, and the desired electrical characteristics of the interconnection structure can also be achieved. Then, after the interconnection structure is formed on the back side of the substrate, the second annealing process can be performed in the atmosphere of gas mixture including hydrogen at a lower temperature. Similarly, the stresses of the interconnection structure on the back side of the substrate can be reduced, and the desired electrical characteristics of the interconnection structure can also be achieved. Furthermore, if the substrate with the device structure and the interconnection structure on the front side is bonded with the TRL wafer after performing the first annealing process, only the second annealing process with a lower temperature is performed to the TRL wafer. Thereby, the performance of the second harmonic distortion is improved. As a result, the performance of the device structure and the second harmonic distortion can be improved simultaneously.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A manufacturing method of a semiconductor device, comprising:
   providing a substrate having a device structure and a first interconnection structure on a front side;
   performing a first annealing process in an atmosphere of pure hydrogen at a first temperature;
   forming a second interconnection structure on a back side of the substrate; and
   performing a second annealing process in an atmosphere of gas mixture comprising hydrogen at a second temperature, after the performing the first annealing process.

2. The manufacturing method of the semiconductor device according to claim 1, wherein the first temperature is higher than the second temperature.

3. The manufacturing method of the semiconductor device according to claim 1, wherein the first temperature is between 350° C. and 450° C.

4. The manufacturing method of the semiconductor device according to claim 1, wherein the second temperature is between 150° C. and 250° C.

5. The manufacturing method of the semiconductor device according to claim 1, wherein the gas mixture comprises 10% to 20% of hydrogen.

6. The manufacturing method of the semiconductor device according to claim 1, wherein the gas mixture further comprises nitrogen, helium, neon, argon, or a combination thereof.

7. The manufacturing method of the semiconductor device according to claim 1, wherein the first annealing process is performed between 30 minutes and 2 hours.

8. The manufacturing method of the semiconductor device according to claim 1, wherein the second annealing process is performed between 30 minutes and 2 hours.

9. The manufacturing method of the semiconductor device according to claim 1, wherein a material of the first interconnection structure comprises Al, Al alloy, Cu, Cu alloy, or a combination thereof.

10. The manufacturing method of the semiconductor device according to claim 1, wherein a material of the second interconnection structure comprises Al, Al alloy, Cu, Cu alloy, or a combination thereof.

11. The manufacturing method of the semiconductor device according to claim 1, wherein the first interconnection structure comprises a plurality of dielectric layers and a plurality of circuit structures.

12. The manufacturing method of the semiconductor device according to claim 1, wherein the second interconnection structure comprises a plurality of dielectric layers and a plurality of circuit structures.

13. The manufacturing method of the semiconductor device according to claim 1, wherein the second interconnection structure is electrically connected to the device structure and the first interconnection structure.

14. The manufacturing method of the semiconductor device according to claim 1, further comprising bonding the substrate with a wafer via the front side of the substrate after performing the first annealing process and before performing the second annealing process.

15. The manufacturing method of the semiconductor device according to claim 14, wherein the wafer comprises a trap rich layer.

* * * * *